(12) United States Patent
Solecky et al.

(10) Patent No.: US 6,789,033 B2
(45) Date of Patent: Sep. 7, 2004

(54) APPARATUS AND METHOD FOR CHARACTERIZING FEATURES AT SMALL DIMENSIONS

(75) Inventors: Eric P. Solecky, Hyde Park, NY (US); Charles N. Archie, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 09/996,399

(22) Filed: Nov. 29, 2001

(65) Prior Publication Data

US 2003/0101013 A1 May 29, 2003

(51) Int. Cl.[7] .............................................. G01D 18/00
(52) U.S. Cl. ...................................................... 702/85
(58) Field of Search ........................ 702/85, 150, 155; 700/114, 229, 115; 250/548, 550; 356/508, 401, 363; 117/84; 355/69; 73/105; 324/753, 158; 382/145; 364/559

(56) References Cited

U.S. PATENT DOCUMENTS

| 5,438,413 A | * | 8/1995 | Mazor et al. ................ 356/508 |
| 6,185,323 B1 | * | 2/2001 | Archie et al. ................ 382/145 |
| 6,581,023 B1 | * | 6/2003 | Kim ........................... 702/155 |
| 2002/0042664 A1 | * | 4/2002 | Kikuchi ....................... 700/114 |

* cited by examiner

Primary Examiner—John Barlow
Assistant Examiner—Tung S Lau
(74) Attorney, Agent, or Firm—Steven Capella

(57) ABSTRACT

Prediction of a functional characteristic(s) and/or description of a physical characteristic(s) of structural features on a substrate is performed using a method where a combination of a weighting function(s) and a correlation function(s) is applied to feedback information from the structural feature. The combination of functions is preferably selected using a calibration database containing (A) information describing a functional performance characteristic of reference structural features, and/or (B) information describing a physical characteristic of reference structural features, and information describing feedback from the reference structural features as a function of position over such reference structural features.

30 Claims, 7 Drawing Sheets

APPARATUS AND METHOD FOR CHARACTERIZING FEATURES AT SMALL DIMENSIONS

BACKGROUND OF THE INVENTION

The present invention relates generally to improved techniques (as well as software and/or apparatus) for analyzing the data produced by measurement imaging tools of semiconductor features such as contact holes and trenches.

In the manufacturing of semiconductor computing chips, a variety of feature defects are impacting the yield of high performing computer chips. One example of this is the failure of holes to be cleared of resist after lithographic exposure and develop which can go undetected. Timely detection of this condition and related ones can allow the product to be saved by rework. Even in situations where rework is not an option, early detection of feature flaws can be important. As the printed dimensions shrink and the fidelity of printing is challenged by lower k lithography, detection of such defects becomes more challenging.

Most modern electric circuits are formed as "printed" circuits on a substrate. In the field of circuit fabrication, one of the more critical functions is the ability to control the size (length, width, height), or critical dimensions (CD), of features such as contact holes and trenches which form the circuits. Any deviation in the dimensions of a feature can adversely impact on the performance of the resulting circuitry.

As critical features become smaller, metrology (the science of measurement) using imaging tools such as optical microscopes, scanning electron microscopes (SEM), atomic force microscopes (AFM), and other similar tools becomes more challenging. The challenge is especially acute for contact holes and trenches with diameters less than 0.25 $\mu$m. For example, reduced collection efficiency of SEM secondary electrons from such contact holes and trenches can provide false edge sharpening. For this and other reasons, current measurement methodologies are poor in their correlation with cross section results taken from actual samples. Reduced collection efficiency also may interfere with obtaining critical information from the bottom of a contact hole.

U.S. Pat. No. 6,185,323, entitled "Method characterizing a feature using measurement imaging tool" teaches the importance of analyzing the information obtained from a critical dimension imaging tool that lies between the hole feature edges. More specifically, U.S. Pat. No. 6,185,323 discussed fitting the data profile or waveform between the edge locations to a quadratic or trapezoidal mathematical form. The "goodness-of-fit" of this fitting provides a metric to distinguish clearly open holes from clearly closed ones. This technique is also valuable for detecting other kinds of feature defects in other geometries (lines, spaces, etc). The disclosure of U.S. Pat. No. 6,185,323 is incorporated herein by reference.

Unfortunately, the technique of U.S. Pat. No. 6,185,323 often fails to have good discriminating power for holes with diameters less than about 180 nm. In the more general applications of this technique to other geometries, there are issues at small dimensions as well. Other conventional approaches such as (a) simple waveform correlation where a template is acquired from a "golden" wafer fail to provide sufficient discrimination capability, and (b) the conventional approaches discussed in the background of U.S. Pat. No. 6,185,323, are even more deficient in this regard.

The deficiencies of these methodologies show that a need still exists for a method which will accurately and reliably characterize a substrate features such as a contact hole or trench, especially as the dimensions of such features continue to shrink.

SUMMARY OF THE INVENTION

The invention provides improved analytical methods as well as software, system and apparatus implementing the improved analytical techniques. In one aspect, the invention encompasses use of a combination of weighting function(s) and correlation function(s) (e.g., mathematical forms, templates, etc.) in the analysis of feedback from structural features. The invention also encompasses the concept of a calibration database useful for determining a suitable combination of weighting and correlation functions, especially where the calibration database contains information relating to the actual performance or function of reference structural features. The invention also encompasses methods, apparatus, systems and software involving such calibration database and/or the use of a combination of weighting and correlating functions to characterize substrate features.

In one aspect, the invention encompasses a calibration database stored in a computer readable medium, the database comprising:
  (a) information elements describing at least one functional performance characteristic of respective structural features on a substrate, and
  (b) information elements describing feedback from the respective structural features as a function of position over each of the respective structural features.

The calibration database preferably further comprises (c) information elements describing physical analysis of each of the respective structural features. The feedback preferably is secondary electron emission from the structural features upon exposure to a scanning electron beam. The structural features are preferably holes in a resist layer a semiconductor substrate. The functional performance characteristic is preferably the response of each respective hole to an etching protocol.

In another aspect, the invention encompasses a method for evaluation of target structural features on a substrate, the method comprising:
  (a) providing information elements describing feedback from the target structural features as a function of position over each of the respective target structural features on the substrate,
  (b) applying a combination of a weighting function and a correlation function to the target structural feature information elements to predict a functional performance characteristic of respective target structural features and/or to describe a physical characteristic of respective target structural features.

Preferably, a functional performance characteristic, such as etchability across the target feature, is predicted in step (b). The structural features are preferably holes in a resist layer on the substrate. The information elements are preferably embodied in computer-readable media, and step (b) is preferably performed using a computer. The invention also encompasses systems, apparatus, and/or computer programs for carrying out the above method(s).

In another aspect, the invention encompasses, a method for evaluation of target structural features on a substrate, the method comprising:
  (a) providing a calibration database comprising:
    (i) information elements selected from the group consisting of (A) information elements describing a functional performance characteristic of respective reference structural features on a substrate, and (B) information elements describing a physical characteristic of each of the respective reference structural features, or both types of information elements, and (ii) information elements describing feedback from the respective reference structural features as a function of position over each of the respective reference structural features, (b) providing at least one weighting function as a function of position over each of the respective reference structural features and at least one correlation function as a function of position over each of the respective reference structural features, wherein a plurality of weighting functions and/or correlation functions is provided, (c) determining a combination of weighting function and correlation function from the provided which provide a desired degree of correlation between the information elements (i) and (ii) for respective reference structural features, (d) providing information elements describing feedback from the target structural features as a function of position over each of the respective target structural features on the substrate, and (e) applying the combination of weighting function and correlation function to the target structural feature information elements to predict the functional performance characteristic of respective target structural features and/or to describe the physical characteristic of respective target structural features.

Preferably, a plurality of weighting functions and/or a plurality of correlation functions are provided in step (b). The weighting functions and/or correlation functions may be continuous functions and/or discontinuous functions. A value of the weighting function of the determined combination is preferably multiplied with a value of a respective information element in step (e). The calibration database is preferably one as described above. Preferably, the information elements are embodied in a computer-readable medium, and steps (c) and (e) are performed using a computer. The invention also encompasses systems, apparatus, and/or computer programs for carrying out the above method(s).

These and other aspects of the invention are described in further detail below.

DETAILED DESCRIPTION OF THE INVENTION

Figure 1:
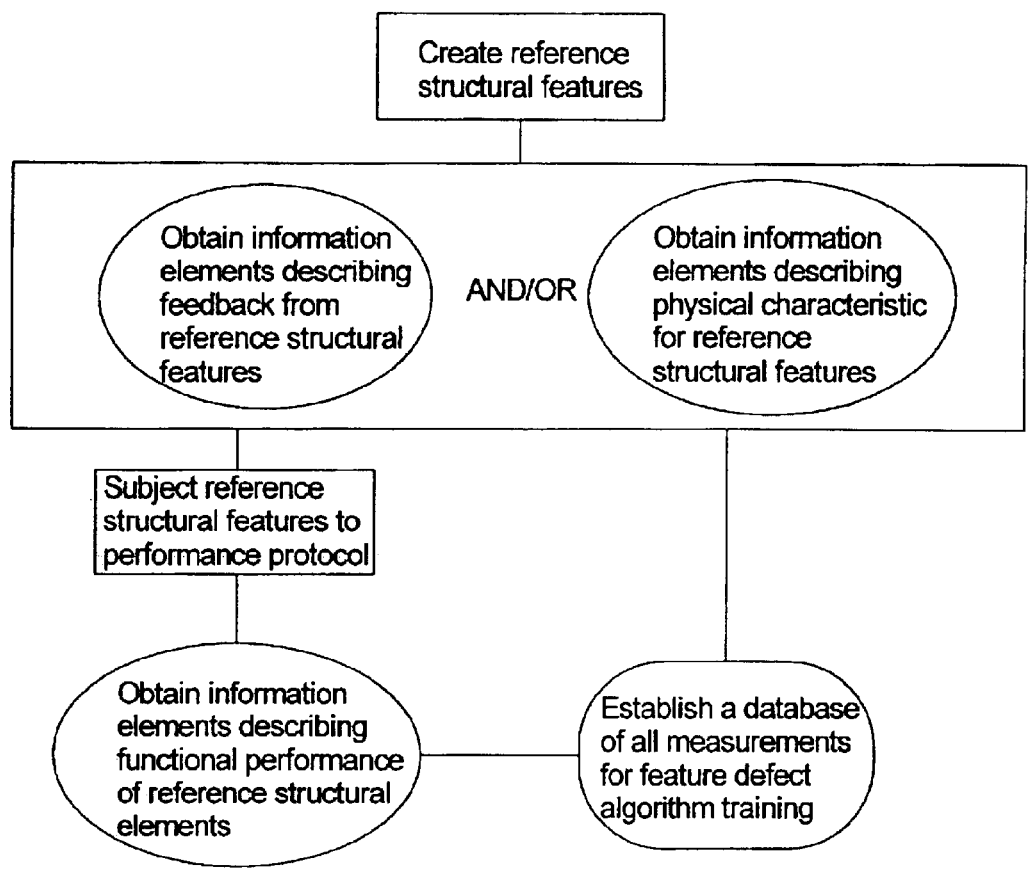
FIG. 1 is a flow chart showing an embodiment of steps for creating a calibration database of the invention.

The invention provides improved analytical techniques as well as software, systems, and apparatus implementing the improved analytical techniques. In one aspect, the invention encompasses use of a combination of weighting function(s) and correlation function(s) (e.g., mathematical forms, templates, etc.) in the analysis of feedback from structural features. The invention also encompasses the concept of a calibration database useful for determining a suitable combination of weighting and correlation functions, especially where the calibration database contains information relating to the actual performance or function of reference structural features. The invention also encompasses methods, apparatus, systems and software involving such calibration database and/or the use of a combination of weighting and correlating functions to characterize substrate features.

The calibration database of the invention is preferably stored in a computer readable medium (e.g., in portable media (floppy disk, hard drive, optical disk, etc. and/or in the memory of a computer or apparatus containing or interfacing with a processor or microprocessor).

The calibration database of the invention comprises (a) information elements describing at least one functional performance characteristic of respective reference structural features on a substrate, and (b) information elements describing feedback from the respective structural features as a function of position over each of the respective structural features. The calibration database preferably further comprises (c) information elements describing physical analysis of each of the respective structural features. The calibration database of the invention is not limited to any specific tool set or measurement technique.

The reference structural features preferably include features representative of those which would be generated in a process of interest (e.g., a stage of manufacturing an integrated circuit device or other article of interest). For example, the reference structural features may be holes in a resist layer in a so-called focus exposure matrix (FEM) wafer. The reference structures most preferably include structures representing examples of the feature defects needing detection. The holes may correspond to locations of trenches, contact holes, etc. (e.g., holes to be etched) in an actual wafer to be used in manufacture. If desired, the reference structural features themselves may be located on a wafer/substrate which is eventually manufactured into integrated circuit devices or other articles.

The information elements (a) describing at least one functional performance characteristic of respective reference structural features on a substrate are preferably obtained by actual processing of the references structural features using a desired manufacturing protocol, followed by characterization of the performance of those structural features. If the structural features include holes in a resist layer where contact holes or trenches are to be etched, the functional performance information elements preferably describe the response of the structural features to a selected etching protocol. Thus, the information elements for functional performance would indicate whether the contact hole or trench was adequately etched in response to the etching protocol. One advantage of including this data in the calibration database is reduction of errors associated with imperfect correspondence between the measured physical state of the reference structural features and the actual performance of the structural features (e.g., a hole that may appear "closed" from the physical data may nevertheless undergo adequate etching or a hole that appears "open" from the physical data may not etch adequately). Other measurements, such as electrical test data can be used if desired.

The information elements (b) describing feedback from the respective structural features as a function of position over each of the respective structural features are preferably waveforms showing secondary electron emission from the structural features upon exposure to a scanning electron beam. This information may be present in the same waveform from which the feature dimension is determined (i.e., the CD-SEM). Other imaging tools which produce a waveform representative of the dimensions of a feature can be used to provide the feedback information elements used in the calibration database of the invention. Examples of such tools include optical microscopes, AFM, and similar tools. A CD-SEM systems is preferred since such tools are already in use for critical dimension measurement. For the CD-SEM, the validity of the waveform from the feature may be tested per the method described in U.S. Pat. No. 6,185,323.

The information elements (c) describing physical analysis of each of the respective structural features include optical microscopes, AFM, and similar tools. The physical analysis tool is preferably a different tool or is employed to measure in a different mode compared to the tool used to obtain the feedback information. For example, one could use a cross section SEM or other measurement because of the particular measurement's ability to provide the information element to correlate with the feedback tool. For example, the AFM depth measurement could be used to determine whether the contact hole is open or closed because AFM does a good job of measuring depth. On the other hand, if the feedback tool for which the algorithm is being constructed is the AFM, it may be necessary to cross section the sample to provide the necessary information element; this is implying the AFM depth measurement is good, but the cross section measurement is better.

Figure 1A:
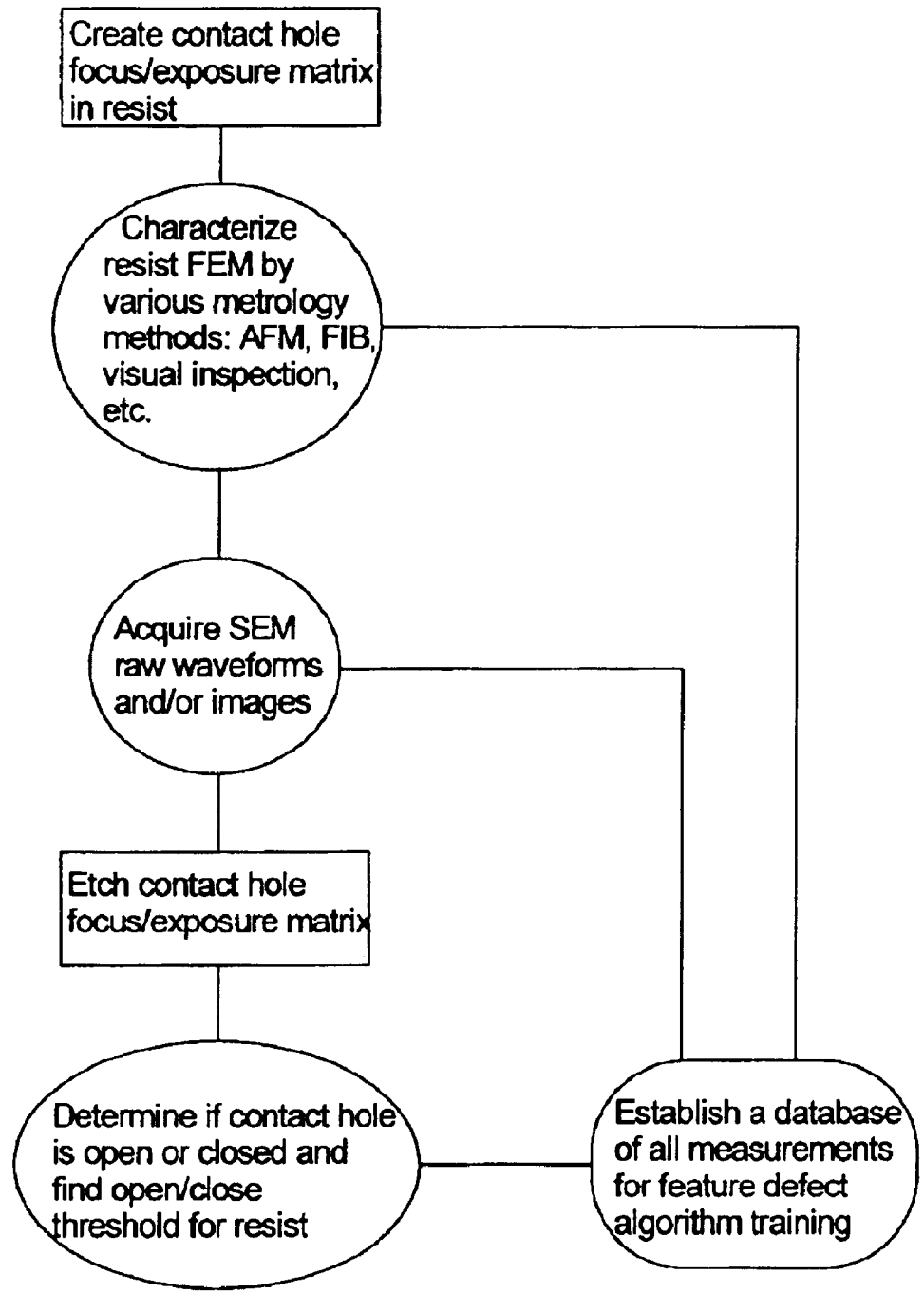
FIG. 1a is a flowchart showing a more specific embodiment of the embodiment described in FIG. 1.

FIG. 1 illustrates a possible method for assembling the calibration database of the invention. FIG. 1a shows a more specific embodiment where the structural feature of interest is a contact hole opening in a resist layer and the performance criterion is response to an etching protocol where the characterization objective is to detect defective holes.

The methods of the invention for evaluation of target structural features on a substrate generally comprise:
  (a) providing information elements describing feedback from the target structural features as a function of position over each of the respective target structural features on the substrate,
  (b) applying a combination of a weighting function and a correlation function to the target structural feature information elements to predict a functional performance characteristic of respective target structural features and/or to describe a physical characteristic of respective target structural features.

Figure 3:
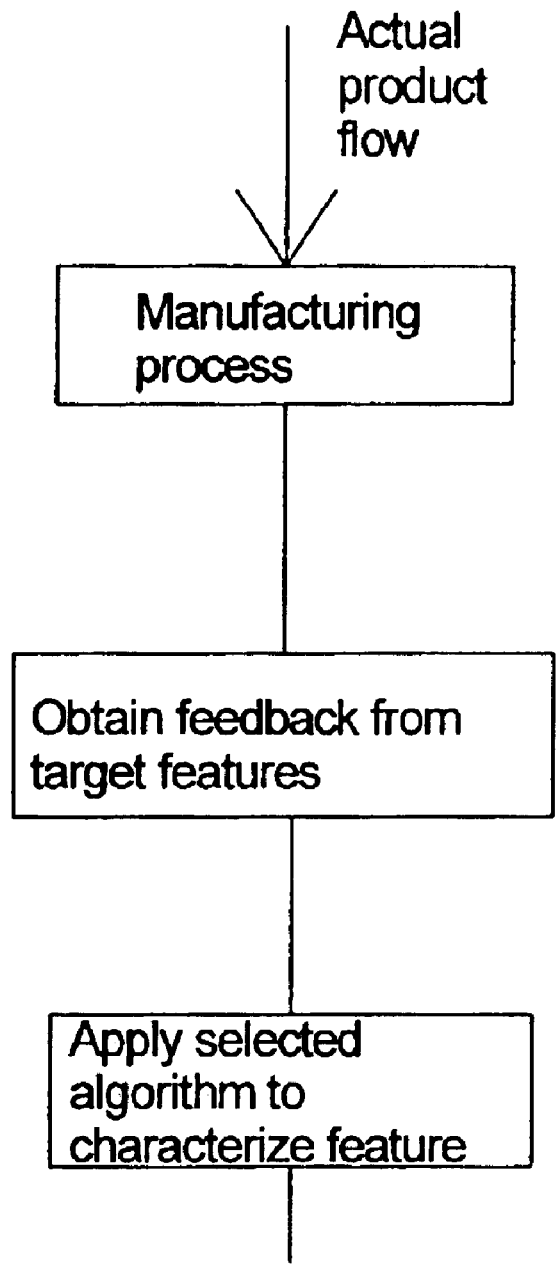
FIG. 3 is a flowchart showing an embodiment of steps for applying an algorithm based on a selected combination of weighting and correlation functions in an actual manufacturing process.
Figure 3A:
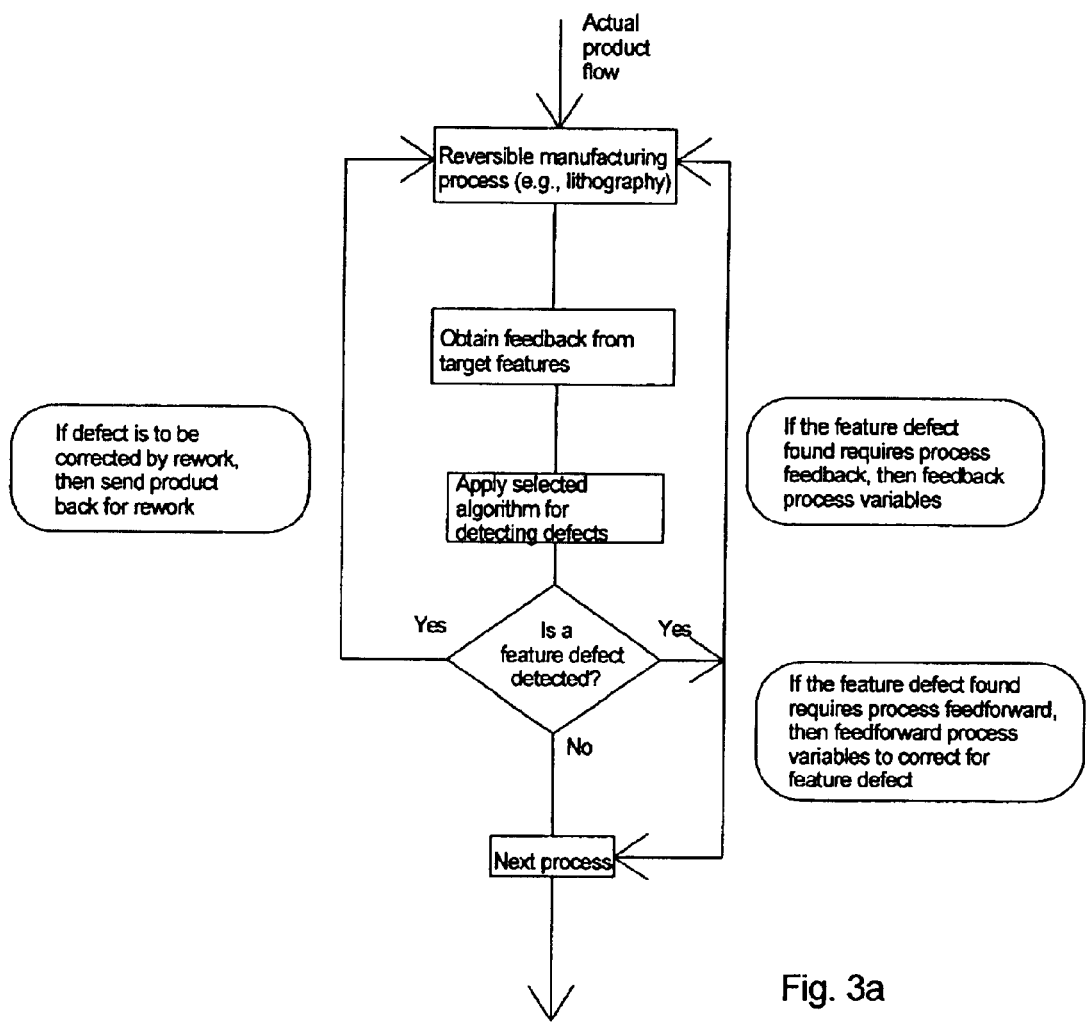
FIG. 3a is a flowchart showing a more specific embodiment of the embodiment described in FIG. 3.

A flowchart of this method is illustrated in FIG. 3 with a more specific embodiment shown in FIG. 3a.

The target structural features provided in step (a) preferably include features generated on a substrate such as a semiconductor wafer in a process of interest (e.g., a stage of manufacturing an integrated circuit device or other article of interest). The target structural features are preferably similar or substantially identical to reference features used in a calibration database for selecting the combination of weighting and correlation functions used in step (b). For example, the target structural features may be holes in a resist layer on a production semiconductor wafer, more preferably holes corresponding to locations of contact holes, etc. (e.g., holes to be etched).

The information elements provided in step (a) are preferably waveforms showing secondary electron emission from the target structural features upon exposure to a scanning electron beam. This information may be present in the same waveform from which the target feature dimension is determined (i.e., a CD-SEM). Other imaging tools which produce a waveform representative of the dimensions of a feature can be used to provide the feedback information elements of step (a). Examples of such tools include optical microscopes, AFM, and similar tools. A CD-SEM systems is preferred since such tools are already in use for critical dimension measurement. For the CD-SEM, the validity of the waveform from the feature may be tested per the method described in U.S. Pat. No. 6,185,323.

The combination of weighting function(s) and correlation function(s) may be any combination that is useful in the desired analytical method of the invention (i.e., provides a desired level of prediction and/or characterization).

The weighting function (s) is preferably used to alter one or more values in the feedback information elements relative to other values in the feedback information elements for a target structural feature of interest. Preferably, the weighting function will act to emphasize portions of information elements (e.g., waveform) likely or known to be relevant to the desired prediction and/or characterization for the target features. The weighting function(s) may be continuous (a waveform) or discontinuous (e.g., a step function). The weighting functions may be expressed in analog or discrete forms. A simple example of a weighting function would be a discrete function that sets portions of the feedback elements to a zero value. Other examples of weighting functions might include functions which de-emphasize peak values above a certain threshold, etc. The choice of weighting function(s) may be affected by various factors such as historical knowledge of the best candidates, computing power needed to implement the weighting function, etc.

The correlation function(s) may be a continuous function (e.g. a parabolic function, a linear function, a trapezoidal shape, etc.), discontinuous function (e.g., a step function, etc.). The correlation function(s) may be a template shape obtained from a known structure. The correlation function(s) may be expressed in analog or discrete forms. The choice of correlation function(s) may be affected by various factors such as historical knowledge of the best candidates, computing power needed to implement the correlation function, etc.

The combination of weighting and correlation functions may selected in any desired manner. Preferably, the combination is selected based on past experience or by mathematical determination such as by using a calibration database. Examples of algorithms for selection of the combination of weighting and correlation functions are shown in FIGS. 2 and 2a.

A starting plurality of possible weighting and/or correlation functions such as described above is provided, preferably in the form of computer code and/or data stored in a computer or computer-readable medium. A reference structure database such as:
  (a) the calibration database described above, or
  (b) a calibration database containing (i) information elements selected from the group consisting of (A) information elements describing a functional performance characteristic of respective reference structural features on a substrate, and (B) information elements describing a physical characteristic of each of the respective reference structural features, or both types of information elements, and (ii) information elements describing feedback from the respective reference structural features as a function of position over each of the respective reference structural features, or other database of reference structure feedback information may be used.

Figure 2:
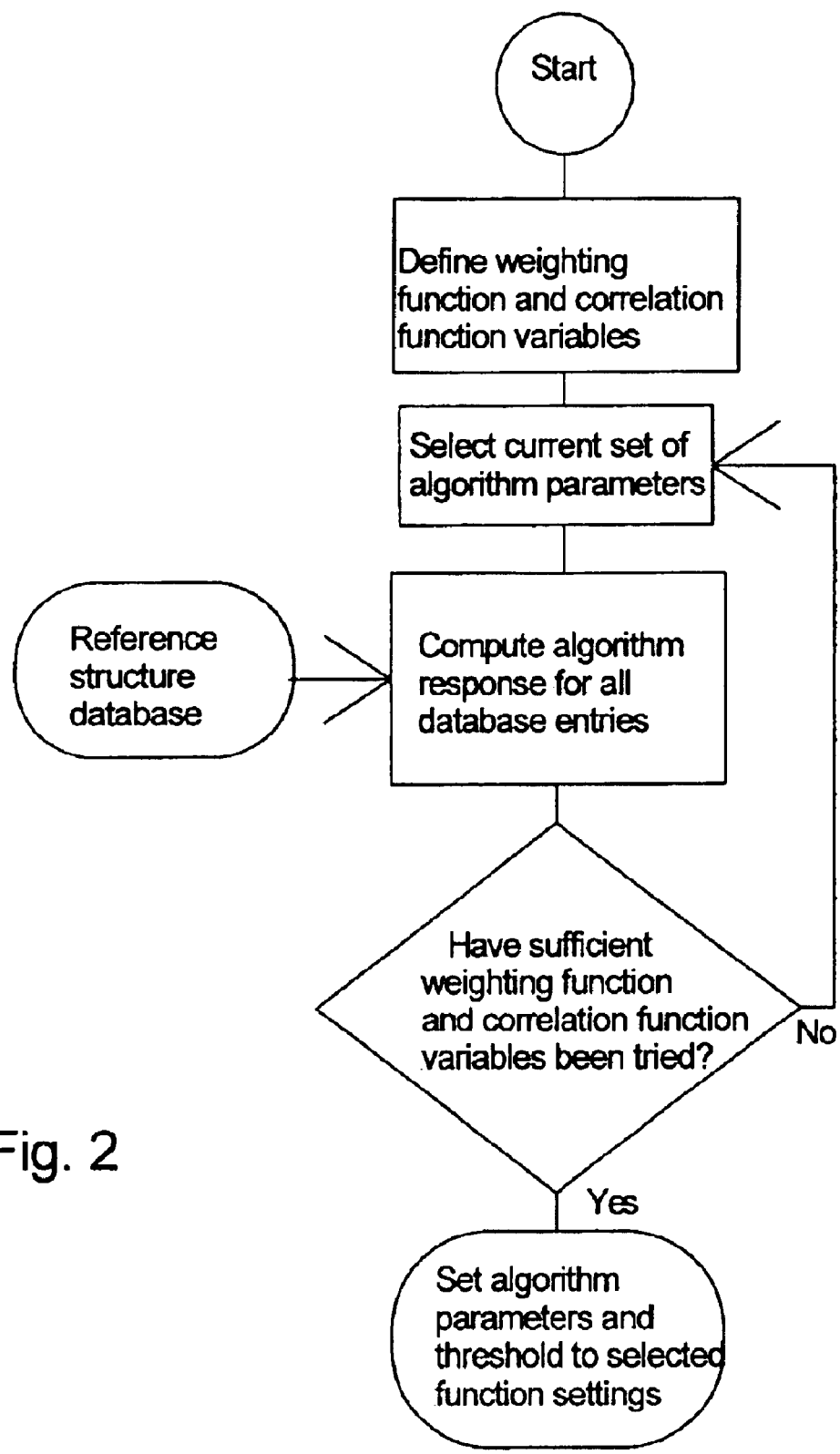
FIG. 2 is a flowchart showing an embodiment of steps for selection of weighting and correlation functions for algorithm training.
Figure 2A:
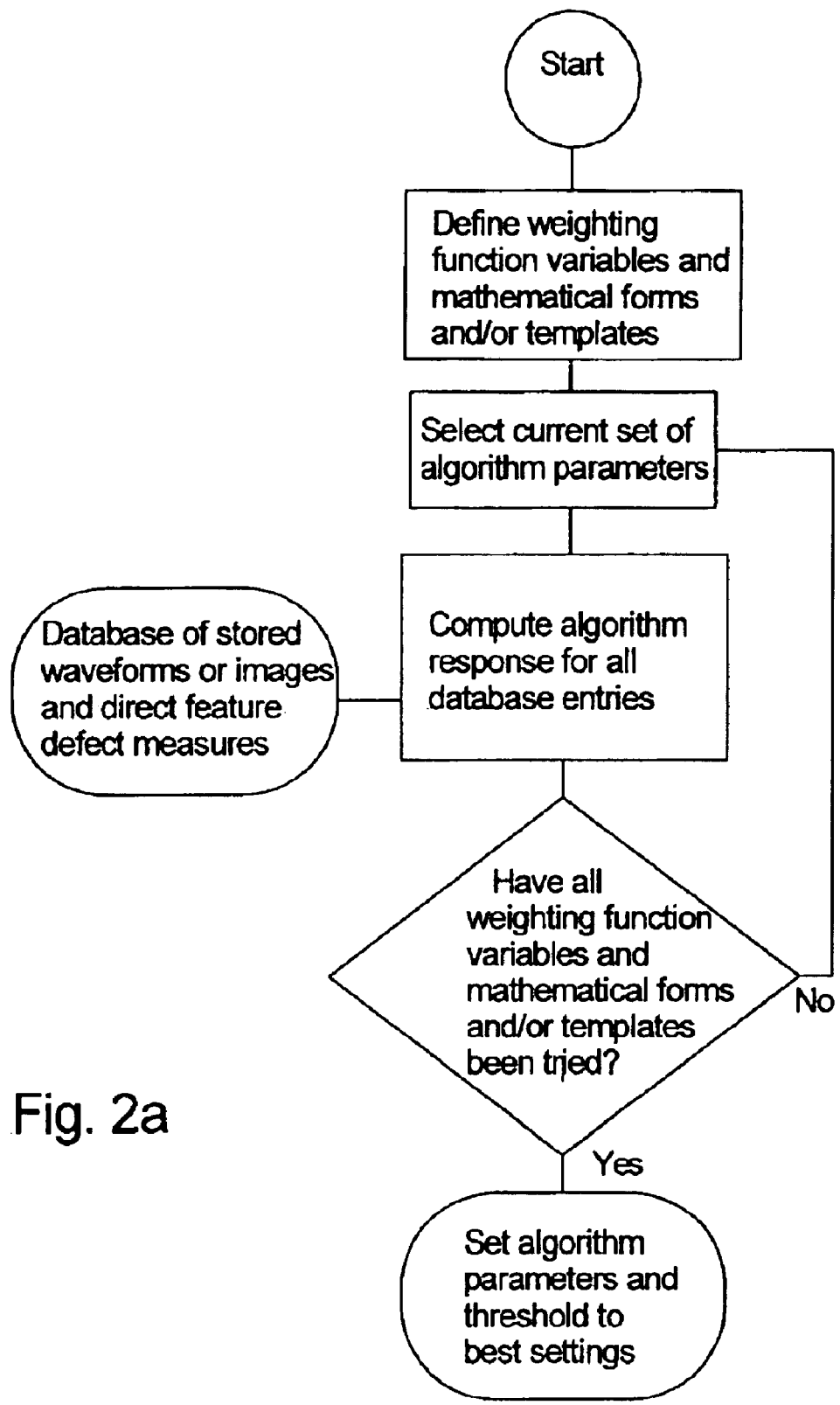
FIG. 2a is a flowchart showing a more specific embodiment of the embodiment described in FIG. 2.

Referring to FIGS. 2 and 2a, a starting combination of weighting and correlation functions is selected from among those available. The weighting function is then applied to the information elements describing the feedback from the reference structural features (contained in the calibration database) to alter at least one information element for a given structure.

The weighted information elements for each reference structure are each then fitted by the selected correlation function. The quality of each fit (curve to data) is represented by a correlation factor, in this case $r^2$ (a higher $r^2$ implies a better fit, where an $r^2$ of one represents a perfect fit).

"correlation" refers to the interdependence between two sets of numbers. The correlation is a relation between two quantities, such that when one changes the other does (simultaneous increasing or decreasing is called positive correlation; one increasing, the other decreasing, is called negative correlation). The "correlation coefficient" is a number between −1 and 1 which indicates the degree of linear relationship between two sets of numbers. If the two sets of numbers are $(x_1, x_2, \ldots, x_n)$ and $(y_1, y_2, \ldots, y_n)$, the coefficient of correlation r measures how near the points $(x_1, y_1), (x_2, y_2), \ldots, (x_n, y_n)$ are lying on a straight line. If r=1, the points lie on a line and the two sets of data are said to be in perfect correlation. More particularly, in the presence of weighting factors $(w_1, w_2, \ldots, w_n)$ the coefficient of correlation r is defined to be the quotient of the sum of the products of the corresponding numbers of the two sets with the weighting factors and the square root of the product of the sum of the squares of the numbers of each set with the weighting factors:

$$r = \frac{\sum x_i y_i w_i}{\sqrt{\sum x_i^2 w_i \sum y_i^2 w_i}}$$

Figure 2B:
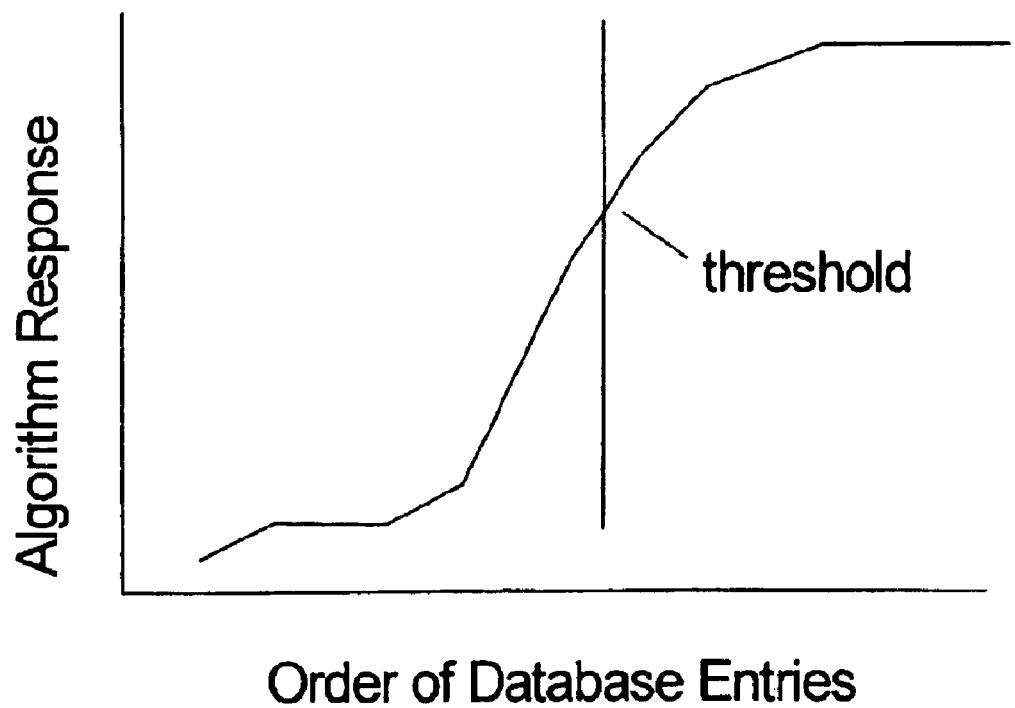
FIG. 2b shows a correlation plot as a function of a feature parameter.

The correlation coefficient is then plotted as a function of the information elements corresponding to the respective physical and/or functional performance characteristic of the respective reference structure. An example of such a plot is shown in FIG. 2b.

With the algorithm output plotted in this order, the resulting curve should have the largest slope at threshold for the ideal theoretical case. Where the the physical and/or functional performance characteristic information is binary (e.g., whether a hole etches or not or whether a hole is open or not), theoretically, the optimized algorithm would produce a similar response (i.e., a step function at the threshold). More practically, however, the response of the algorithm will be a continuous function and a threshold needs to be determined—in this situation the evaluation of the algorithm using the selected combination of weighting function and correlation function evaluates the sensitivity of the algorithm response in the vicinity of the transition from no fit (i.e., the correlation factor $r^2$ is far from unity) to good fit (i.e., the correlation factor $r^2$ approaches unity). The relative sensitivity (the slope) is then preferably recorded and another combination of weighting and correlation functions is selected and similar calculations are performed. The process can be iterated in this manner through all possible combinations of weighting and correlation functions have been tried and/or until a target sensitivity has been reached. If desired, the selection process may be stopped by a computation time/expense limit. The implementation of this concept preferably acts to enhance the response of the algorithm to characterize the feature of interest while at the same time ignoring secondary effects. Thus, the algorithm may be able to characterize features more accurately and/or characterize features of smaller dimension (e.g., on the order of 100 nm).

Once the algorithm with the desired combination of weighting and correlation functions is determined, the algorithm may be applied to feedback information elements (e.g., secondary electron emission or whatever type of feedback used in the selection of the algorithm functions) from target structural features to determine a physical characteristic of such features and/or predict functional performance of such features. Two embodiments of such implementations are shown in FIGS. 3 and 3a. The algorithm can be used not only for flagging product needing rework, but also for identifying product needing other kinds of process adjustment (e.g., feed forward correction). Preferably, the algorithm is used to predict a functional performance characteristic, such as etchability of the target feature. For example, it can be definitively predicted whether the contact hole opening in a resist layer was open or closed at post develop, prior to etch. This ability enables the wafer or other substrate to be reworked easily.

The information elements used in the methods of the invention are preferably embodied in a computer or computer-readable medium, and the steps of the invention such as selection of weighting and/or correlation functions, characterization/prediction, etc. are preferably performed using a computer.

The invention also encompasses systems and/or apparatus for carrying out the method(s) of the invention. For example, the invention encompasses systems and/or apparatus for evaluation of target structural features on a substrate, comprising:

(a) a calibration database in a computer-readable medium, the database comprising:
  (i) information elements selected from the group consisting of information elements describing a functional performance characteristic of respective reference structural features on a substrate and information elements describing physical analysis of each of the respective reference structural features, and
  (ii) information elements describing feedback from the respective structural features as a function of position over each of the respective reference structural features, (b) information elements in a computer-readable medium corresponding to at least one weighting function as a function of position over each of the respective reference structural features, and at least one correlation function as a function of position over each of the respective reference structural features, wherein a plurality of weighting functions and/or correlation functions is provided, (c) means for determining a combination of weighting function and correlation function from the provided which provide a desired degree of correlation between the information elements (i) and (ii) for respective reference structural features, (d) information elements in a computer-readable medium describing feedback from the target structural features as a function of position over each of the respective target structural features on the substrate, (e) means for applying the combination of weighting function and correlation function to the target structural feature information elements to predict the functional performance characteristic of respective target structural features and/or to describe the physical characteristic of respective target structural features.

The means (c) preferably comprises executable code stored in a computer readable medium and a computer capable of executing the code. The means (e) preferably comprises executable code stored in a computer readable medium and a computer capable of executing the code. The system may further include a means for obtaining the feedback information elements (e.g. a CD-SEM tool, AFM, optical microscope, etc.).

The invention also encompasses systems and/or apparatus for evaluation of target structural features on a substrate, comprising:

(a) information elements in a computer-readable medium describing feedback from the target structural features as a function of position over each of the respective target structural features on the substrate, (b) means for applying a combination of weighting function and correlation function to the target structural feature information elements to predict a functional performance characteristic of respective target structural features and/or to describe a physical characteristic of respective target structural features.

The means (b) preferably comprises executable code stored in a computer readable medium and a computer capable of executing the code. The system may further include a means for obtaining the feedback information elements (e.g. a CD-SEM tool, AFM, optical microscope, etc.).

The invention also encompasses computer programs stored in a computer-readable medium for carrying out the method(s) of the invention. For example, the invention encompasses computer programs having computer-executable code for:

(a) creating a calibration database comprising:
  (i) information elements selected from the group consisting of (A) information elements describing a functional performance characteristic of respective reference structural features on a substrate, and (B) information elements describing a physical characteristic of each of the respective reference structural features, or both types of information elements, and
  (ii) information elements describing feedback from the respective reference structural features as a function of position over each of the respective reference structural features, (b) providing at least one weighting function as a function of position over each of the respective reference structural features and at least one correlation function as a function of position over each of the respective reference structural features, wherein a plurality of weighting functions and/or correlation functions is provided, (c) determining a combination of weighting function and correlation function from the provided which provide a desired degree of correlation between the information elements (i) and (ii) for respective reference structural features, (d) obtaining information elements describing feedback from the target structural features as a function of position over each of the respective target structural features on the substrate, and (e) applying the combination of weighting function and correlation function to the target structural feature information elements to predict the functional performance characteristic of respective target structural features and/or to describe the physical characteristic of respective target structural features.

The invention also encompasses a computer program stored in a computer-readable medium, the program performing a method of evaluating target structural features on a substrate, the method comprising:

(a) obtaining information elements describing feedback from the target structural features as a function of position over each of the respective target structural features on the substrate, (b) applying a combination of a weighting function and a correlation function to the target structural feature information elements to predict a functional performance characteristic of respective target structural features and/or to describe a physical characteristic or respective target structural features.

The computer programs of the invention may be resident in a computer which is part of an analytical tool such as a CD-SEM. Alternatively, the programs of the invention may be in some other computer-accessible form (e.g., on separate computer, on portable computer-readable media, etc.).

What is claimed is:

1. A method for evaluation of target structural features on a substrate said method comprising:
  (a) providing a calibration database comprising:
    (i) information elements selected from the group consisting of (A) information elements describing a functional performance characteristic of respective reference structural features on a substrate, and (B) information elements describing a physical characteristic of each of said respective reference structural features, or both types of information elements, and
    (ii) information elements describing feedback from said respective reference structural features as a function of position over each of said respective reference structural features,
  (b) providing at least one weighting function as a function of position over each of said respective reference structural features and at least one correlation function as a function of position over each of said respective reference structural features, wherein a plurality of weighting functions and/or correlation functions is provided,
  (c) determining a combination of weighting function and correlation function from said provided which provide a desired degree of correlation between said information elements (i) and (ii) for respective reference structural features,
  (d) providing information elements describing feedback from said target structural features as a function of position over each of said respective target structural features on said substrate, and
  (e) applying said combination of weighting function and correlation function to said target structural feature information elements to predict said functional performance characteristic of respective target structural features and/or to describe said physical characteristic of respective target structural features.

2. The method of claim 1 wherein a plurality of weighting functions and a plurality of correlation functions are provided in step (b).

3. The method of claim 1 wherein said weighting functions are selected from the group consisting of continuous functions and discontinuous functions.

4. The method of claim 1 wherein a value of said weighting function of said determined combination of step (c) is multiplied with a value of a respective information element in step (e).

5. The method of claim 1 wherein said calibration database includes information elements describing a functional performance characteristic of respective reference structural features on a substrate, and said functional performance characteristic is predicted in step (e).

6. The method of claim 1 wherein said structural features are holes in a resist layer on said substrate.

7. The method of claim 1 wherein all of said information elements are embodied in a computer-readable medium and steps (c) and (e) are performed using a computer.

8. The method of claim 1 wherein said feedback of steps (a) and (e) comprises secondary electron emission from said structural features upon exposure to a scanning electron beam.

9. The method of claim 1 wherein steps (c) and (e) include performance of linear regression analysis.

10. The method of claim 1 wherein said physical characteristic is a depth profile across said structural feature and said functional performance characteristic is etchability across said structural feature.

11. The method of claim 5 wherein said functional performance characteristic is the etchability across said target feature.

12. The method of claim 6 wherein said functional performance characteristic is a response of each respective hole to an etching protocol.

13. A method for evaluation of target structural features on a substrate, said method comprising:
(a) providing information elements describing feedback from said target structural features as a function of position over each of said respective targ t structural features on said substrate,
(b) applying a combination of a weighting function and a correlation function to said target structural feature information elements to predict a functional performance characteristic of respective target structural features and/or to describe a physical characteristic of respective target structural features.

14. The method of claim 13 wherein a value of said weighting function is multiplied with a value of a respective information element in step (b).

15. The method of claim 13 wherein a functional performance characteristic is predicted in step (b).

16. The method of claim 13 wherein said structural features are holes in a resist layer on said substrate.

17. The method of claim 13 wherein all of said information elements are embodied in computer-readable media and steps (c) and (e) are performed using a computer.

18. The method of claim 13 wherein said feedback comprises secondary electron emissions from said structural features upon exposure to a scanning electron beam.

19. The method of claim 15 wherein said functional performance characteristic is the etchability across said target feature.

20. The method of claim 16 wherein said functional performance characteristic is a response of each respective hole to an etching protocol.

21. A system for evaluation of target structural features on a substrate, said system comprising:
(a) a calibration database in a computer-readable medium, said database comprising:
(i) information elements selected from the group consisting of information elements describing a functional performance characteristic of respective reference structural features on a substrate and information elements describing physical analysis of each of said respective reference structural features, and
(ii) information elements describing feedback from said respective structural features as a function of position over each of said respective reference structural features,
(b) information elements in a computer-readable medium corresponding to at least one weighting function as a function of position over each of said respective reference structural features, and at least one correlation function as a function of position over each of said respective reference structural features, wherein a plurality of weighting functions and/or correlation functions is provided,
(c) means for determining a combination of weighting function and correlation function from said provided which provide a desired degree of correlation between said information elements (i) and (ii) for respective reference structural features,
(d) information elements in a computer-readable medium describing feedback from said target structural features as a function of position over each of said respective target structural features on said substrate,
(e) means for applying said combination of weighting function and correlation function to said target structural feature information elements to predict said functional performance characteristic of respective target structural features and/or to describe said physical characteristic of respective target structural features.

22. The system of claim 21 wherein said means (c) comprises executable code stored in a computer readable medium and a computer capable of executing said code.

23. The system of claim 21 wherein said means (e) comprises executable code stored in a computer readable medium and a computer capable of executing said code.

24. The system of claim 21 wherein said physical characteristic is a depth profile across said structural feature and said functional performance characteristic is etchability across said structural feature.

25. An apparatus for evaluation of target structural features on a substrate, said apparatus comprising:
(a) information elements in a computer-readable medium describing feedback from said target structural features as a function of position over each of said respective target structural features on said substrate,
(b) means for applying a combination of weighting function and correlation function to said target structural feature information elements to predict a functional performance characteristic of respective target structural features and/or to describe a physical characteristic of respective target structural features.

26. The apparatus of claim 25 further comprising means for obtaining said information elements.

27. The apparatus of claim 26 wherein said means for obtaining said information elements includes a scanning electron beam.

28. A computer program stored in a computer-readable medium, said program performing a method of evaluating target structural features on a substrate, said method comprising:
(a) creating a calibration database comprising:
(i) information elements selected from the group consisting of (A) information elements describing a functional performance characteristic of respective reference structural features on a substrate, and (B)

information elements describing a physical characteristic of each of said respective reference structural features, or both types of information elements, and (ii) information elements describing feedback from said respective reference structural features as a function of position over each of said respective reference structural features, (b) providing at least one weighting function as a function of position over each of said respective reference structural features and at least one correlation function as a function of position over each of said respective reference structural features, wherein a plurality of weighting functions and/or correlation functions is provided, (c) determining a combination of weighting function and correlation function from said provided which provide a desired degree of correlation between said information elements (i) and (ii) for respective reference structural features, (d) obtaining information elements describing feedback from said target structural features as a function of position over each of said respective target structural features on said substrate, and (e) applying said combination of weighting function and correlation function to said target structural feature information elements to predict said functional performance characteristic of respective target structural features and/or to describe said physical characteristic of respective target structural features.

29. The computer program of claim 28 wherein said physical characteristic is a depth profile across said structural feature and said functional performance characteristic is etchability across said structural feature.

30. A computer program stored in a computer-readable medium, said program performing a method of evaluating target structural features on a substrate, said method comprising:

(a) obtaining information elements describing feedback from said target structural features as a function of position over each of said respective target structural features on said substrate, (b) applying a combination of a weighting function and a correlation function to said target structural feature information elements to predict a functional performance characteristic of respective target structural features and/or to describe a physical characteristic of respective target structural features.

* * * * *